(12) United States Patent
Liu et al.

(10) Patent No.: US 11,211,952 B2
(45) Date of Patent: Dec. 28, 2021

(54) ENCODING METHOD, COMMUNICATION METHOD, AND APPARATUS

(71) Applicant: HUAWEI TECHNOLOGIES CO., LTD., Guangdong (CN)

(72) Inventors: Xiaojian Liu, Shenzhen (CN); Yuejun Wei, Shanghai (CN); Chen Zheng, Shanghai (CN); Liang Ma, Shanghai (CN)

(73) Assignee: Huawei Technologies Co., Ltd., Guangdong (CN)

( * ) Notice: Subject to any disclaimer, the term of this patent is extended or adjusted under 35 U.S.C. 154(b) by 0 days.

(21) Appl. No.: 16/527,626

(22) Filed: Jul. 31, 2019

(65) Prior Publication Data
US 2019/0356335 A1    Nov. 21, 2019

Related U.S. Application Data

(63) Continuation of application No. PCT/CN2018/075128, filed on Feb. 2, 2018.

(30) Foreign Application Priority Data

Feb. 4, 2017   (CN) .......................... 201710064592.7

(51) Int. Cl.
*H03M 13/00* (2006.01)
*H03M 13/11* (2006.01)
*H04L 1/00* (2006.01)

(52) U.S. Cl.
CPC ....... *H03M 13/616* (2013.01); *H03M 13/116* (2013.01); *H03M 13/1157* (2013.01); *H03M 13/618* (2013.01); *H03M 13/6393* (2013.01); *H03M 13/6516* (2013.01); *H04L 1/0057* (2013.01); *H04L 1/0061* (2013.01)

(58) Field of Classification Search
CPC ............. H03M 13/616; H03M 13/618; H03M 13/6393; H03M 13/1157; H03M 13/6516; H03M 13/116
See application file for complete search history.

(56) References Cited

U.S. PATENT DOCUMENTS

2018/0198466 A1* 7/2018 Chiu .................... H03M 13/116
2018/0226992 A1* 8/2018 Panteleev ........... H03M 13/618

FOREIGN PATENT DOCUMENTS

| CN | 101141133 A | 3/2008 |
|---|---|---|
| CN | 101399554 A | 4/2009 |
| CN | 104485970 A | 4/2015 |

(Continued)

OTHER PUBLICATIONS

LG Electronics, "LDPC Codes Design for eMBB data channel", 3GPP TSG RAN WG1 NR ad-hoc, R1-1700518, Jan. 20, 2017 (Year: 2017).*

(Continued)

*Primary Examiner* — Joseph D Torres
(74) *Attorney, Agent, or Firm* — Fish & Richardson P.C.

(57) ABSTRACT

The present disclosure relates 10 encoding methods, communication methods and apparatus. In one example method, a first information sequence is encoded by using a first matrix to obtain a second information sequence, where the first matrix meets a function related to a lifting factor and an element in $E_{max}(H)$. The second information sequence is outputted.

9 Claims, 7 Drawing Sheets

(56) References Cited

FOREIGN PATENT DOCUMENTS

WO 2018088923 A1 5/2018

OTHER PUBLICATIONS

LG Electronics, "Performance results of LDPC codes for eMBB", 3GPP TSG RAN WG1 NR ad-hoc, R1-1700519, Jan. 20, 2017 (Year: 2017).*

Huawei et al., "LDPC design for eMBB data," 3GPP TSG RAN WG1 NR Ad-Hoc Meeting, R1-1700092; Spokane, USA, XP051207634, Jan. 16-20, 2017, 18 pages.

ZTE et al., "Consideration on LDPC design for NR," 3GPP TSG RAN WG1 #86bis, R1-1608974; Lisbon, Portugal, Oct. 10-14, 2016,13 pages.

Extended European Search Report issued in European Application No. 18748161.9 dated Nov. 15, 2019, 11 pages.

LG Electronics, "LDPC Codes Design for eMBB data channel," 3GPP TSG RAN WG1 NR ad-hoc, R1-1700518; Spokane, USA, XP051208049, Jan. 16-20, 2017, 6 pages.

Huawei et al., "Design Aspects of Polar and LDPC codes for NR," 3GPP TSG RAN WG1 Meeting #87, R1-1611259; Reno, USA, Nov. 14-18, 2016, 15 pages.

LG Electronics, "Performance results of LDPC codes for eMBB," 3GPP TSG RAN WG1 NR ad-hoc, R1-1700519; Spokane, USA, XP051208050, Jan. 16-20, 2017, 5 pages.

Polyanskii et al., "Floor Scale Modulo Lifting for QC-LDPC codes," XP055638512, Jan. 25, 2017, 5 pages.

PCT International Search Report and Written Opinion issued in International Application No. PCT/CN2018/075128 dated Apr. 27, 2018, 13 pages (with English translation).

* cited by examiner

ENCODING METHOD, COMMUNICATION METHOD, AND APPARATUS

CROSS-REFERENCE TO RELATED APPLICATIONS

This application is a continuation of International Application No. PCT/CN2018/075128, filed on Feb. 2, 2018, which claims priority to Chinese Patent Application No. 201710064592.7, filed on Feb. 4, 2017. The disclosures of the aforementioned applications are hereby incorporated by reference in their entireties.

TECHNICAL FIELD

Embodiments of the present invention relate to the communications field, and in particular, to an encoding method, a communication method, and an apparatus.

BACKGROUND

A low-density parity-check (low density parity check. LDPC for short) code denotes a family of linear block codes each with a sparse check matrix. LDPC has desirable performance approaching to a Shannon limit, and features a flexible structure and relatively low decoding complexity. Therefore, the LDPC can be widely applied to various communications systems.

A quasi-cyclic low-density parity-check (quasi-cyclic low density parity check. QC-LDPC for short) code is an important branch of the LDPC code. A check matrix of the QC-LDPC code includes a plurality of block matrices of a same size. These block matrices are all-zero man ices and cyclic shift matrices. The QC-LDPC code is easily implemented and therefore has been used in a plurality of communications systems.

After a location of a non-zero cyclic shift matrix in the check matrix of the QC-LDPC code is determined, offset values of various cyclic shift matrices greatly influence error floors of corresponding code words. For a QC-LDPC code supporting a flexible and adjustable code length, sizes of a series of block matrices are usually defined by setting lifting factors z of the block matrices. A size of each block matrix is z×z. In this way, check matrices of different sizes are obtained to adapt to different code lengths.

However, an existing computing method for a check matrix of an LDPC code needs to be further optimized.

SUMMARY

Embodiments of this application provide an encoding method, a communication method, and an apparatus, to maintain a relatively low bit-error-rate floor.

According to a first aspect, an encoding method is provided. The method includes:

encoding a first information sequence by using a first matrix 10 obtain a second information sequence, where the first matrix is a matrix whose size is $m_b z \times n_b z$, z is a lifting factor, the first matrix includes $m_b \times n_b$ submatrices whose sizes are z×z, the $m_b \times n_b$ submatrices whose sizes are z×z include at least one cyclic shift matrix whose size is z×z and that is based on an identity matrix, and a cyclic shift value of each cyclic shift matrix is an element that is in a matrix E(H) and that is at a location corresponding to the cyclic shift matrix, where the matrix E(H) is $$\begin{bmatrix} a_{11} & a_{12} & \cdots & a_{1n_b} \\ a_{21} & a_{22} & \cdots & a_{2n_b} \\ \vdots & \vdots & \ddots & \vdots \\ a_{m_b 1} & a_{m_b 2} & \cdots & a_{m_b n_b} \end{bmatrix},$$

an element $a_{ij}$ in E(H) meets $$a_{ij} = \begin{cases} a_{ijEmax} & \text{if } a_{ijEmax} < 1 \\ f(r_1(a_{ijEmax}, z), r_2(z)) & \text{otherwise} \end{cases},$$

and $a_{ijEmax}$ is an element in a cyclic shift value matrix $E_{max}(H)$ corresponding to a maximum lifting factor $z_{max}$, $r_1(a_{ijEmax}, z)$ represents a function whose parameters are $a_{ijEmax}$ and z, $r_2(z)$ represents a function whose parameter is z, $f(r_1(a_{ijEmax}, z), r_2(z))$ represents a function whose parameters are $r_1(a_{ijEmax}, z)$ and $r_2(z)$, and a value of $f(r_1(a_{ijEmax}, z) r_2(z)$ is less than z; and outputting the second information sequence.

In the encoding method provided in this embodiment of this application, a relatively low bit-error-rate floor can be maintained, and storage space occupied can be reduced.

In a possible design, $z_{max}$ may be a predefined value.

In a possible design, after a lifting factor value is determined based on the first information sequence or another functional unit inputs a lifting factor value to an encoder, the encoder may correct the lifting factor value. The corrected value is z, which is finally used. In the method in this embodiment of this application, the lifting factor is corrected, so that z is marked, and some values of z causing relatively poor performance can be avoided, thereby further optimising performance.

In a possible design, a value of $r_1(a_{ijEmax}, z)$ is determined based on a sum of an offset value corresponding to z and $a_{ijEmax}$.

In a possible design, $r_1(a_{ijEmax}, z)$ may include any one of the following:

$r_1(a_{ij}, z) = a_{ijEmax} + \text{Int}(a_{ijEmax}/c) \cdot s_z$;

$r_1(a_{ij}, z) = a_{ijEmax} + \text{Int}(c/a_{ijEmax}) \cdot s_z$;

$r_1(a_{ijEmax} + \text{Int}(s_z/a_{ijEmax})$;

$r_1(a_{ij}, z) = a_{ijEmax} + \text{Int}(a_{ijEmax}/z)$;

$r_1(a_{ij}, z) = a_{ijEmax} + (z_{max} - a_{ijEmax}) \cdot s_z$; and $r_1(a_{ijEmax}, z) = a_{ijEmax} + \text{Int}(s_z \cdot a_{ijEmax})/c)$.

Based on $r_1(a_{ijEmax}, z)$, $r_1)a_{ijEmax}$, z) may be further restricted by using $r_2(z)$ and $f(r_1(a_{ijEmax}, z) r_2(z)$, $r_2(z)$ includes any one of the following:

$r_2(z) = z$;

$r_2(z) = 2^{\text{floor}(\log 2(z))}$; and $r_2(z) = N_z$; where $N_z$ is a positive integer related to z, and $f(r_1(a_{ijEmax}, z), r_2(z)) = r_1(a_{ijEmax}, z) \mod r_2(z)$.

In a possible design, $r_1(a_{ij}, z) = (a_{ijEmax} + s_z) \text{MOD } z_{max}$, $r_2(z) = z/z_{max}$, and $f(r_1(a_{ijEmax}, z), r_2(z)) = \text{Int}(r_1(a_{ijEmax}, z) \cdot r_2(z))$.

According to the method, a relatively low bit-error-rate floor can be maintained, and storage space occupied can be reduced. In addition, performance can be improved while a relatively small granularity of the lifting factor is ensured.

According to a second aspect, a communication method is provided. In the communication method, the foregoing encoding method is used to obtain a second information sequence; and the second information sequence is processed and the processed second information sequence is sent.

According to the communication method to which the encoding method according to the first aspect is applied, data transmission performance can be improved.

According to a third aspect, an apparatus is provided. The apparatus includes a memory and a processor. The memory is configured to store a first information sequence. The processor is configured to implement a processing process in the encoding method according to the first aspect.

According to a fourth aspect, an apparatus is provided. The apparatus includes at least one processor and a memory coupled to the at least one processor, where the at least one processor is configured to execute an instruction in the memory, to implement the encoding method according to the first aspect.

In a possible design, the apparatus according to the third aspect or the fourth aspect may be an encoder.

According to a fifth aspect, a communications device including the apparatus according to the third aspect or the fourth aspect is further provided.

In a possible design, the communications device may be a terminal device or a network device.

Another aspect of this application provides a computer-readable storage medium. The computer-readable storage medium stores an instruction. When the instruction is run on a computer, the computer is enabled to perform the method according to the foregoing aspects.

DESCRIPTION OF EMBODIMENTS

Figure 1:
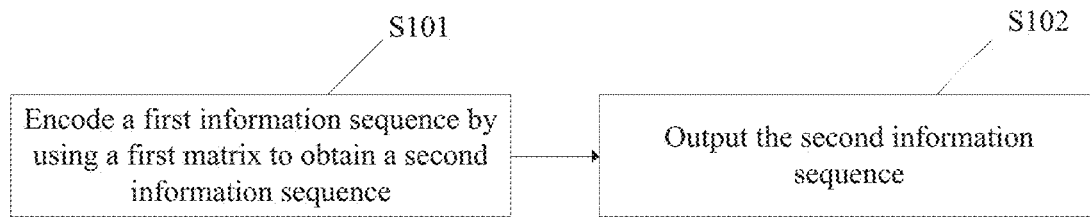
FIG. 1 is a schematic flowchart of an encoding method according to an embodiment of this application.

Embodiments of this application may be applied to a wireless communications system including wireless communications devices such as a network device and a terminal device (terminal device or terminal equipment). The wireless communications system is, for example, an LTE system, or another wireless communications system using various wireless access technologies, for example, a system using access technologies such as code division multiple access, frequency division multiple access, time division multiple access, orthogonal frequency division multiple access, and single-carrier frequency division multiple access, and a subsequent evolved system such as a fifth-generation (5G) system. The wireless communications device in the embodiments of this application may be any device in the wireless communications system, for example, the network device or the terminal device.

The terminal device may be a device that provides a user with voice or data connectivity, a handheld device with a wireless connection function, or another processing device connected to a wireless modem. The wireless terminal may communicate with one or more core networks through a radio access network (radio access network, RAN for short). The wireless terminal may be a mobile terminal, such as a mobile phone (also referred to as a "cellular" phone) and a computer with a mobile terminal, for example, may be a portable, pocket-sized, handheld, computer's built-in, or in-vehicle mobile apparatus, which exchanges voice or data with the radio access network. For example, it may be a device such as a personal communication service (personal communication service, PCS for short) phone, a cordless telephone set, a session initiation protocol (session initiation protocol, SIP for short) phone, a wireless local loop (wireless local loop, WLL for short) station, or a personal digital assistant (personal digital assistant, PDA for short). The wireless terminal may also be referred to as a system, a subscriber unit (subscriber unit, SU for short), a subscriber station (subscriber station, SS for short), a mobile station (mobile station, MS for short), a remote station (remote station, RS for short), an access point (access point, AP for short), a remote terminal (remote terminal, RT for short), an access terminal (access terminal, AT for short), a user terminal (user terminal, UT for short), a user agent (user agent, UA for short), a user device, or user equipment (user equipment, UE for short).

The network device may be a base station, or an access point, or may be a device in communication with a wireless terminal via one or more sectors at an air interface in an access network. The base station may be configured to mutually convert a received over-the-air frame and an IP packet and serve as a router between the wireless terminal and a remaining portion of the access network. The remaining portion of the access network may include an Internet protocol (Internet protocol, IP for short) network. The base station may coordinate attribute management of the air interface. For example, the base station may be a base transceiver station (Base Transceiver Station, BTS for short) in GSM or CDMA, or may be a NodeB (NodeB) in WCDMA, or may be an evolved NodeB (evolvedNodeB, eNodeB for short) in LTE. This is not limited in this application.

An embodiment of this application provides an encoding method. The encoding method may be implemented by using, for example, an encoder on a communications device. As shown in FIG. 1, the encoding method may include the following steps.

S101: Encode a first information sequence by using a first matrix to obtain a second information sequence, where the first matrix is a matrix whose size is $m_b z \times n_b z$, z is a lifting factor, the first matrix includes $m_b \times n_b$ submatrices whose sizes are $z \times z$, the $m_b \times n_b$ submatrices whose sizes are $z \times z$ include at least one cyclic shift matrix whose size is $z \times z$ and that is based on an identity matrix, and a cyclic shift value of each cyclic shift matrix is an element that is in a matrix E(H) and that is at a location corresponding to the cyclic shift matrix, where the matrix E(H) is $$\begin{bmatrix} a_{11} & a_{12} & \cdots & a_{1n_b} \\ a_{21} & a_{22} & \cdots & a_{2n_b} \\ \vdots & \vdots & \ddots & \vdots \\ a_{m_b1} & a_{m_b2} & \cdots & a_{m_bn_b} \end{bmatrix},$$

an element $a_{ij}$ in E(H) meets $$a_{ij} = \begin{cases} a_{ijEmax} & \text{if } a_{ijEmax} < 1 \\ f(r_1(a_{ijEmax}, z), r_2(z)) & \text{otherwise} \end{cases},$$

$a_{ij} \in \{-1, 0, 1, 2, \ldots z-1\}$, and $a_{ijEmax}$ is an element in a cyclic shift value matrix $E_{max}(H)$ corresponding to a maximum lifting factor $z_{max}$, $r_1(a_{ijEmax}, z)$ represents a function whose parameters are $a_{ijEmax}$ and z, $r_2(z)$ represents a function whose parameter is z, $f(r_1(a_{ijEmax}, z), r_2(z))$ represents a function whose parameters are $r_1(a_{ijEmax}, z)$ and $r_2(z)$, and a value of $f(r_1(a_{ijEmax}, z), r_2(z))$ is less than z.

In a possible implementation, $r_2(z)$ may be a predefined value. Therefore, $E_{max}(H)$ may also be a fixed value.

It may be understood that the first matrix may further include an all-zero submatrix whose size is z×z for the all-zero submatrix, a value of an element of the all-zero submatrix at a corresponding location in E(H) is −1.

In a possible implementation, E(H) may be understood as a result obtained after adjustment performed based on $E_{max}(H)$. Specifically, $E_{max}(H)$ may be stored in the communications device. For different lifting factors, corresponding E(H) may be obtained by using $E_{max}(H)$, and then the first matrix is finally obtained.

For example, it is assumed that $z_{max}=8$, and an LDPC code matrix whose size is $(8z_{max}, 4z_{max})$ may be represented by using $H_{z_{max}}$ and $E_{z_{max}}(H)$ as follows:

$$H_{z_{max}} = \begin{bmatrix} P^0 & O & O & P^0 & P^1 & P^0 & O & O \\ O & P^3 & P^4 & O & O & P^0 & P^0 & O \\ O & P^2 & O & P^6 & P^0 & O & P^0 & P^0 \\ P^3 & O & P^5 & O & P^1 & O & O & P^0 \end{bmatrix},$$

where O represents a submatrix of an all-zero matrix, and $P^{a_{ijEmax}}$ represents a cyclic shift matrix whose offset value is $a_{ijEmax}$. A specific value of $a_{ijEmax}$ is determined based on $E_{z_{max}}(H)$, where $$E_{z_{max}}(H) = \begin{bmatrix} 0 & -1 & -1 & 0 & 1 & 0 & -1 & -1 \\ -1 & 3 & 4 & -1 & -1 & 0 & 0 & -1 \\ -1 & 2 & -1 & 6 & 0 & -1 & 0 & 0 \\ 3 & -1 & 5 & -1 & 1 & -1 & -1 & 0 \end{bmatrix}.$$

Therefore, when z=4, assuming that E(H) is determined by using $$a_{ij} = \begin{cases} a_{ijEmax} & \text{if } a_{ijEmax} < 1 \\ (a_{ijEmax} + 3) \bmod z & \text{otherwise} \end{cases},$$

corresponding E(H) and H obtained may be as follows:

$$E(H) = \begin{bmatrix} 0 & -1 & -1 & 0 & 1 & 0 & -1 & -1 \\ -1 & 2 & 3 & -1 & -1 & 0 & 0 & -1 \\ -1 & 1 & -1 & 1 & 0 & -1 & 0 & 0 \\ 2 & -1 & 0 & -1 & 0 & -1 & -1 & 0 \end{bmatrix}, \text{ and}$$

$$H = \begin{bmatrix} P^0 & O & O & P^0 & P^1 & P^0 & O & O \\ O & P^2 & P^3 & O & O & P^0 & P^0 & O \\ O & P^1 & O & P^1 & P^0 & O & P^0 & P^0 \\ P^2 & O & P^0 & O & P^0 & O & O & P^0 \end{bmatrix}.$$

In a possible implementation, a value of z may be determined by the encoder based on a length of the first information sequence. Alternatively, in a possible implementation, a value of z may be determined by another functional unit and then input into the encoder. In different scenarios or rules, the encoder or the another functional unit may determine the value of z in different manners. In this embodiment of this application, a manner of determining the value of z by the encoder or the another functional unit is not limited.

Optionally, to further improve performance, after the encoder determines a lifting factor value based on the first information sequence or the another functional unit inputs a lifting factor value into the encoder, the encoder corrects the value. The corrected value is z, which is finally used. A specific correction manner is described in subsequent embodiments.

Further, the communications device completes the encoding of the first information sequence by using the first matrix, to obtain the second information sequence.

In a possible implementation, the first information sequence may be padded through zero padding (zero padding), or be padded by using another known bit sequence, so that a length of the padded information sequence is equal to that of an input information sequence supported by the first matrix. Then, an operation is performed by using the first matrix and the padded information sequence to obtain a parity bit. An information bit and the parity bit are merged for outputting, to obtain an encoded sequence, namely, the second information sequence.

In a possible implementation, the cyclic shift matrix based on the identity matrix may be a matrix obtained based on the identity matrix and the cyclic shift value. The cyclic shift value represents a quantity of times that the identity matrix is cyclically shifted rightward. For example, the cyclic shift matrix is obtained by performing cyclical shift rightward on each row of the identity matrix for a same quantity of times. When the cyclic shift value is 0, the cyclic shift matrix is represented as the identity matrix.

In an example, it is assumed that an identity matrix having a size of 4 is $$\begin{bmatrix} 1 & 0 & 0 & 0 \\ 0 & 1 & 0 & 0 \\ 0 & 0 & 1 & 0 \\ 0 & 0 & 0 & 1 \end{bmatrix},$$

and the cyclic shift value is 1. In this case, a corresponding cyclic shift matrix is $$\begin{bmatrix} 0 & 1 & 0 & 0 \\ 0 & 0 & 1 & 0 \\ 0 & 0 & 0 & 1 \\ 1 & 0 & 0 & 0 \end{bmatrix}.$$

S102: Output the second information sequence.

In a possible implementation, the second information sequence obtained in S101 is output by the encoder.

In this embodiment of this application, the first matrix meets a function related to a lifting factor and an element in $E_{max}(H)$, a relatively low bit-error-rate floor can be maintained, and storage space occupied can be reduced. In addition, performance can be improved while a relatively small granularity of the lifting factor is ensured. The granularity of the lifting factor refers to an interval between two neighboring lifting factors.

Specifically, for different lifting factors, $E_{max}(H)$ may be used to obtain corresponding $E(H)$. There may be different methods. To be specific, each function of $r_1(a_{ijEmax}, z)$, $r_2(z)$, and $f(r_1(a_{ijEmax}, z), r_2(z))$ may be expressed in a plurality of different forms.

For example, $r_1(a_{ijEmax}, z)$ may be expressed in the following forms:

$$r_1(a_{ij}, z) = a_{ijEmax} + \text{Int}(a_{ijEmax}/c) \cdot s_z; \tag{a}$$

$$r_1(a_{ij}, z) = a_{ijEmax} + \text{Int}(c/a_{ijEmax}) \cdot s_z; \tag{b}$$

$$r_1(a_{ij}, z) = a_{ijEmax} + \text{Int}(s_z/a_{ijEmax}); \tag{c}$$

$$r_1(a_{ij}, z) = a_{ijEmax} + \text{Int}(a_{ijEmax}/z); \tag{d}$$

$$r_1(a_{ij}, z) = a_{ijEmax} + (z_{max} - a_{ijEmax}) \cdot s_z; \tag{e}$$

$$r_1(a_{ij}, z) = (a_{ijEmax} + s_z) \bmod z_{max}; \tag{f}$$

and $$r_1(a_{ijEmax}, z) = a_{ijEmax} + \text{Int}((s_z \cdot a_{ijEmax})/c). \tag{g}$$

In the foregoing formulas, c is a preset constant, $s_z$ is a value corresponding to z, and the value of $s_z$ may be a nonnegative integer in a range. In a possible implementation, $s_z$ corresponding to z may be obtained through table lookup. Int( ) is a rounding function, and may be a rounding-up function or a rounding-down function, mod is a modulo operation. In the foregoing description, (a) to (g) may all be understood as the forms of adding an offset value to $a_{ijEmax}$, but a difference lies in that in the manner shown in (f), a result obtained by adding the offset value to $a_{ijEmax}$ is limited to a range. Further, the offset value is determined in different forms. For example, an offset value corresponding to z may be determined based on z. Examples are not enumerated for description in this embodiment of this application.

$r_2(z)$ may be expressed in the following forms:

$$r_2(z) = z; \tag{h}$$

$$r_2(z) = z/z_{max}; \tag{i}$$

and $$r_2(z) = 2^{\text{floor}(\log_2(z))}, \tag{j}$$

where floor represents rounding down;

$$r_2(z) = N_z, \tag{k}$$

where $N_z$ is a positive integer less than z. For example, $N_z$ corresponding to z may be obtained through table lookup. A value range of $N_z$ may be $2^t$ or $k \cdot 2^t$, where k and t are both nonnegative integers.

$f(r_1(a_{ijEmax}, r_2(z))$ may be expressed in the following forms:

$$f(r_1(a_{ijEmax}, z), r_2(z)) = r_1(a_{ijEmax}, z) \bmod r_2(z); \tag{m}$$

$$f(r_1(a_{ijEmax}, z), r_2(z)) = \text{Int}(r_1(a_{ijEmax}, z) \cdot r_2(z)). \tag{n}$$

The foregoing $r_1(a_{ijEmax}, z)$, $r_2(z)$, and $f(r_1(a_{ijEmax}, z), r_2(z))$ may use different combination manners based on different expression forms thereof. Finally, a value of $f(r_1(a_{ijEmax}, z), r_2(z))$ is less than z.

(1) When a range of $r_1(a_{ijEmax}, z)$ is not limited, $r_1(a_{ijEmax}, z)$ may be further restricted, for example, by using $r_2(z)$ and $f(r_1(a_{ijEmax}, z), r_2(z))$, so that a result of an offset value is not greater than z. For $r_2(z)$, one of (h), (j), (k) may usually be selected, and $r_1(a_{ijEmax}, z)$ is further restricted in the form, for example, (m) in $f(r_1(a_{ijEmax}, z), r_2(z))$.

For example, it is assumed that $r_1(a_{ijEmax}, z)$ uses the form (c) for rounding down, $r_2(z)$ uses the form (h), and $f(r_1(a_{ijEmax}, z), r_2(z))$ uses the form (m). In this case, $a_{ij}$ meets:

$$a_{ij} = \begin{cases} a_{ijEmax} & \text{if } a_{ijEmax} < 1 \\ (a_{ijEmax} + \lfloor s_z / a_{ijEmax} \rfloor) \bmod z & \text{otherwise} \end{cases} \quad \text{Formula (1)}$$

Various first matrices corresponding to different values of z may be obtained by using the formula (1).

Values of $s_z$ may be shown in Table 1. It may be understood that Table 1 is merely an example of the values of $s_z$. Based on the example shown in Table 1, values of $s_z/256$ are obtained through table lookup based on z. The values of $s_z$ may be obtained through a further multiplication operation.

TABLE 1

| Z | $s_z/256$ |
| --- | --- |
| 6 | 7 |
| 7 | 5 |
| 8 | 0 |
| 9 | 0 |
| 10 | 1 |
| 11 | 9 |
| 12 | 3 |
| 13 | 10 |
| 14 | 14 |
| 15 | 5 |
| 16 | 11 |
| 17 | 9 |
| 18 | 0 |
| 19 | 11 |
| 20 | 1 |
| 21 | 12 |
| 22 | 4 |
| 23 | 14 |
| 24 | 10 |
| 25 | 2 |
| 26 | 10 |

TABLE 1-continued

| z | $s_z/256$ |
|---|---|
| 27 | 3 |
| 28 | 2 |
| 29 | 14 |
| 30 | 5 |
| 31 | 14 |
| 32 | 0 |
| 33 | 0 |
| 34 | 6 |
| 35 | 14 |
| 36 | 7 |
| 37 | 11 |
| 38 | 4 |
| 39 | 2 |
| 40 | 1 |
| 41 | 10 |
| 42 | 7 |
| 43 | 14 |
| 44 | 0 |
| 45 | 14 |
| 46 | 7 |
| 47 | 12 |
| 48 | 10 |
| 49 | 12 |
| 50 | 1 |
| 51 | 2 |
| 52 | 10 |
| 53 | 2 |
| 54 | 1 |
| 55 | 6 |
| 56 | 14 |
| 57 | 12 |
| 58 | 7 |
| 59 | 14 |
| 60 | 4 |
| 61 | 8 |
| 62 | 8 |
| 63 | 0 |
| 64 | 0 |
| 66 | 3 |
| 68 | 10 |
| 70 | 14 |
| 72 | 3 |
| 74 | 7 |
| 76 | 13 |
| 78 | 3 |
| 80 | 4 |
| 82 | 10 |
| 84 | 1 |
| 86 | 9 |
| 88 | 13 |
| 90 | 5 |
| 92 | 4 |
| 94 | 0 |
| 96 | 0 |
| 98 | 14 |
| 100 | 1 |
| 102 | 2 |
| 104 | 2 |
| 106 | 2 |
| 108 | 4 |
| 110 | 6 |
| 112 | 14 |
| 114 | 13 |
| 116 | 2 |
| 118 | 12 |
| 120 | 4 |
| 122 | 1 |
| 124 | 7 |
| 126 | 10 |
| 128 | 11 |
| 132 | 1 |
| 136 | 6 |
| 140 | 3 |
| 144 | 3 |
| 148 | 6 |
| 152 | 11 |
| 156 | 2 |
| 160 | 4 |
| 164 | 7 |
| 168 | 6 |
| 172 | 11 |
| 176 | 0 |
| 180 | 6 |
| 184 | 6 |
| 188 | 0 |
| 192 | 0 |
| 196 | 14 |
| 200 | 1 |
| 204 | 2 |
| 208 | 10 |
| 212 | 3 |
| 216 | 13 |
| 220 | 4 |
| 224 | 0 |
| 228 | 1 |
| 232 | 10 |
| 236 | 6 |
| 240 | 1 |
| 244 | 2 |
| 248 | 6 |
| 252 | 11 |
| 256 | 1 |
| 264 | 0 |
| 272 | 9 |
| 280 | 12 |
| 288 | 6 |
| 296 | 6 |
| 304 | 6 |
| 312 | 0 |
| 320 | 0 |
| 328 | 1 |
| 336 | 6 |
| 344 | 6 |
| 352 | 4 |
| 360 | 8 |
| 368 | 0 |
| 376 | 0 |
| 384 | 6 |
| 392 | 10 |
| 400 | 6 |
| 408 | 12 |
| 416 | 0 |
| 424 | 1 |
| 432 | 8 |
| 440 | 4 |
| 448 | 2 |
| 456 | 4 |
| 464 | 13 |
| 472 | 4 |
| 480 | 6 |
| 488 | 2 |
| 496 | 6 |
| 504 | 2 |
| 512 | 0 |

Figure 2:
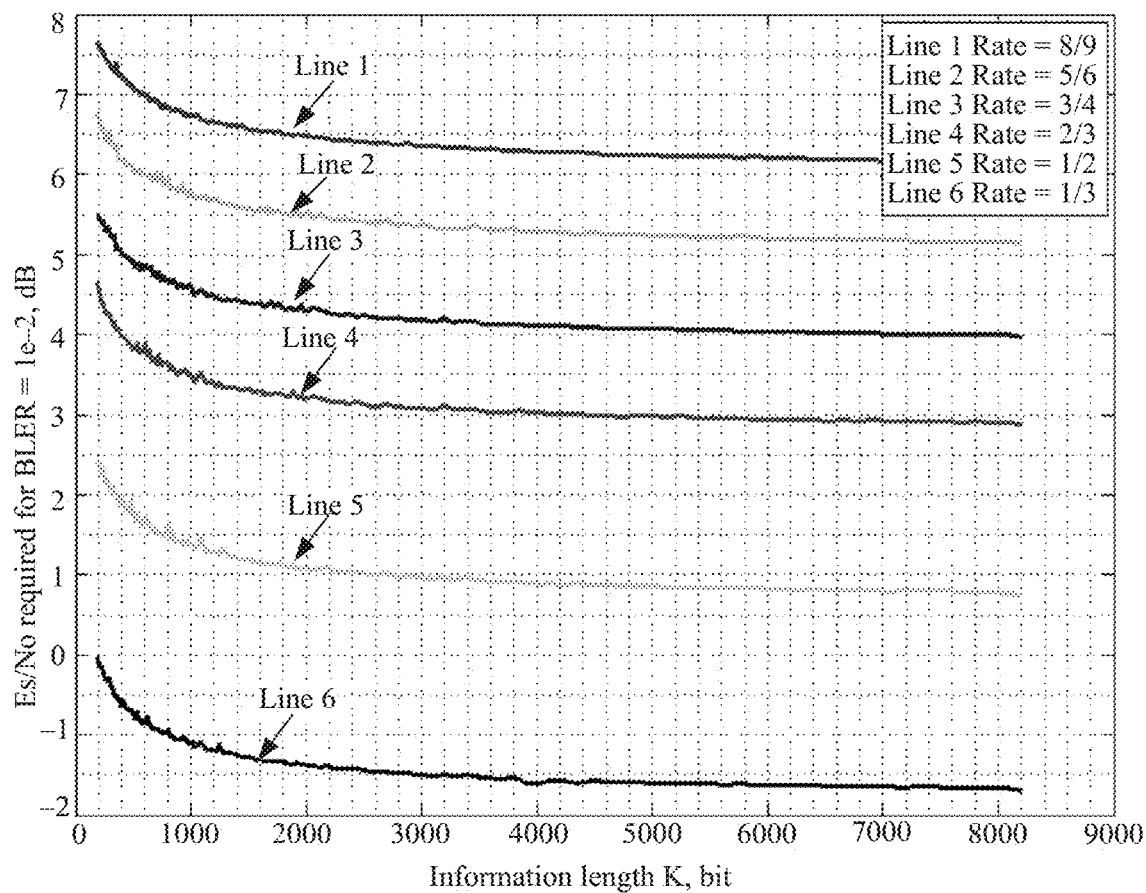
FIG. 2 is a performance simulation diagram of an encoding method according to an embodiment of this application.

Further, FIG. 2 shows block error rate (BLER) simulation results when the formula (1) and Table 1 are used, the length of the first information sequence ranges from 96 to 8192, and bit rates are 8/9, 5/6, 3/4, 2/3, 1/2, 2/5, 1/3, 1/4, and 1/5. A modulation scheme is quadrature phase shift keying (QPSK). A simulation algorithm is a belief propagation (belief propagation, BP for short) algorithm. A quantity of iteration times is 50.

It may be learned from FIG. 2 that at various bit rates and in the full length range, block error rate curves are all relatively smooth.

(2) When the range of $r_1(a_{ijEmax}, z)$ is limited, for example, in (f), a value is limited within $0-z_{max}$ through a modulo operation, the value may be further corrected by using $r_2)z)=z/z_{max}$ and $f(r_1(a_{ijEmax}, z), r_2(z))=\text{Int}(r_1(a_{ijEmax}, z) \cdot r_2(z))$. To be specific, $a_{ij}$ meets:

$$a_{ij} = \begin{cases} a_{ijE\,max} & \text{if } a_{ijE\,max} < 1 \\ \text{Int}((a_{ijE\,max} + s_z)\text{MOD}\,z_{max}) \cdot \dfrac{z}{z_{max}} & \text{otherwise} \end{cases} \quad \text{Formula (2)}$$

Figure 3A:
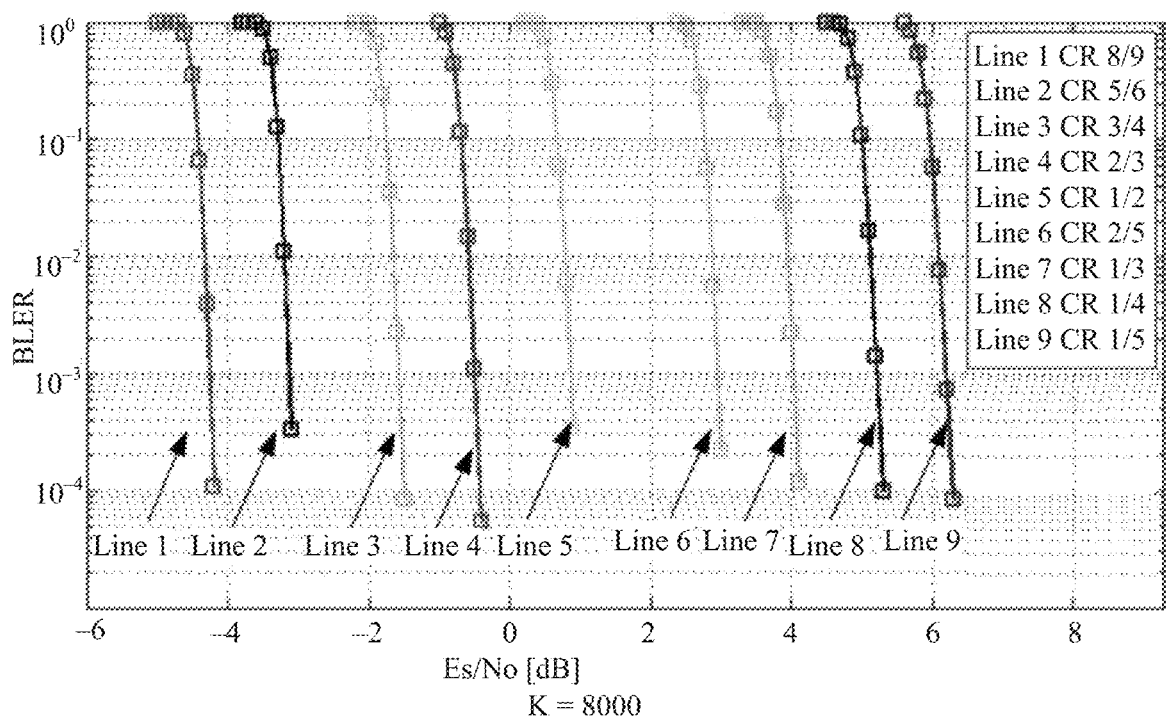
FIG. 3a to FIG. 3c are performance simulation diagrams of an encoding method according to an embodiment of this application.
Figure 3B:
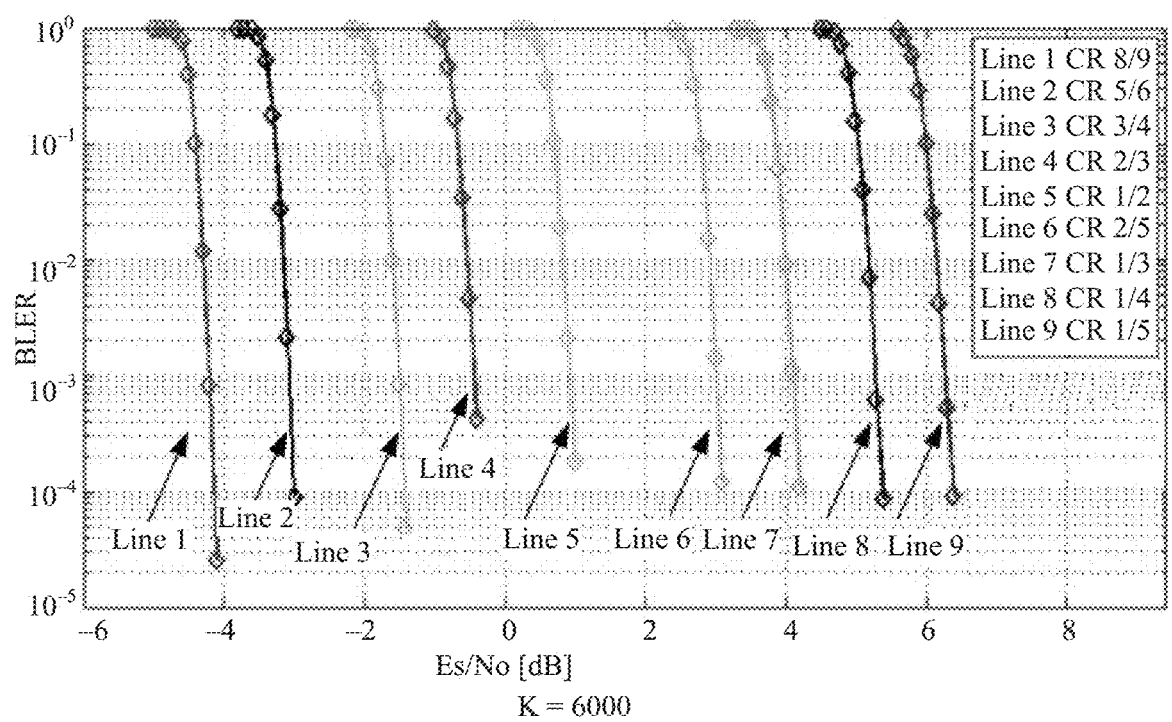
Figure 3C:
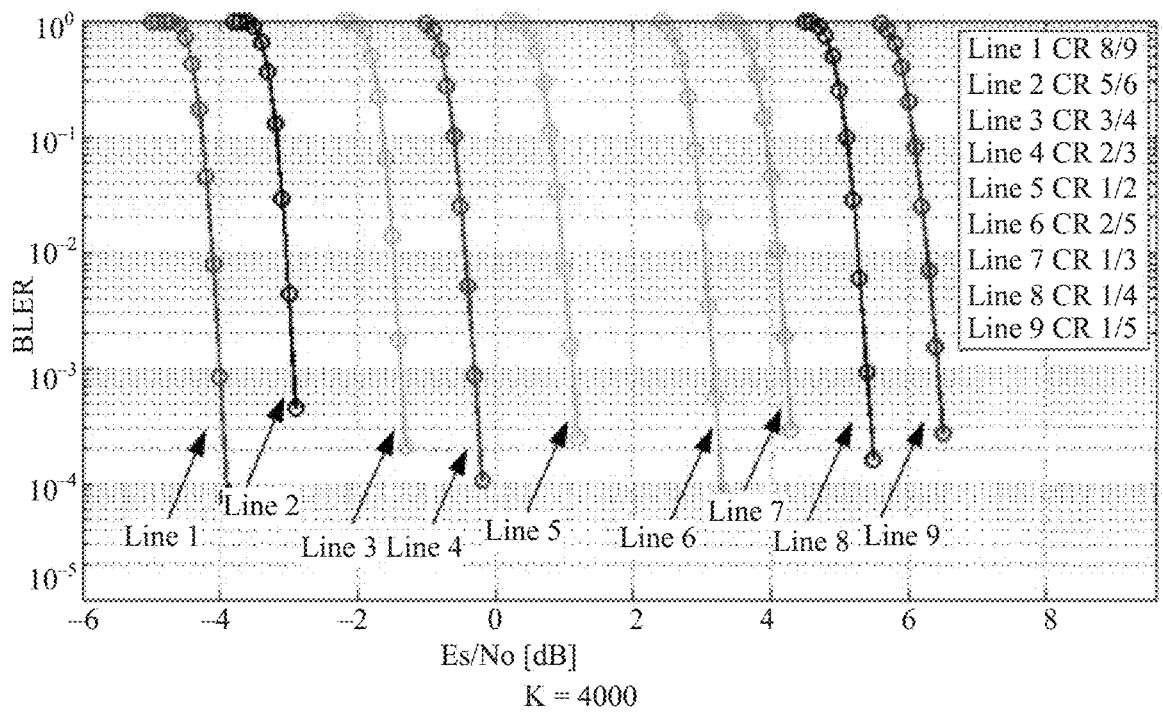
Figure 3D:
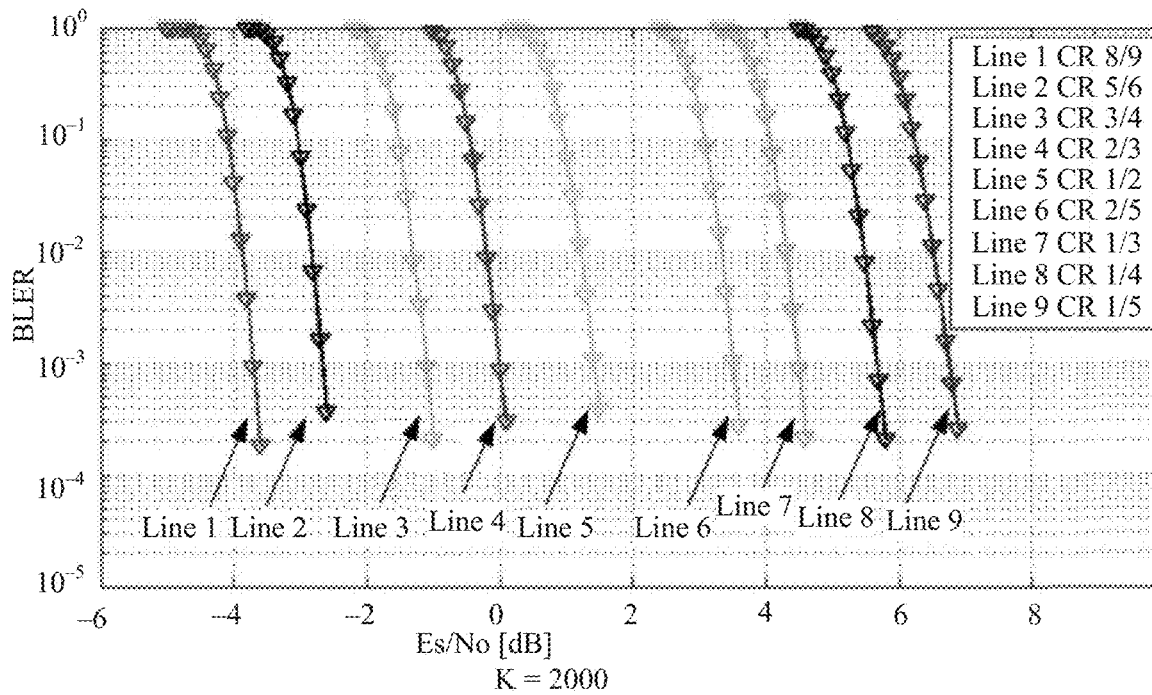
Figure 3E:
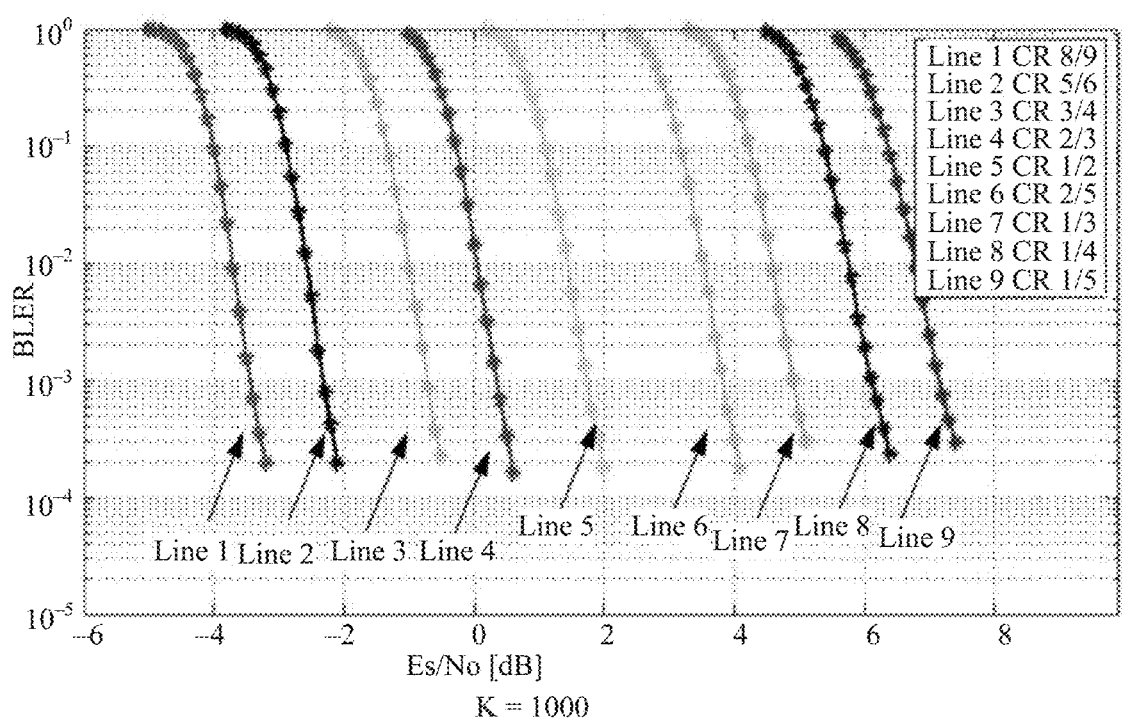

FIG. 3a to FIG. 3c show block error rate simulation results when the formula (2) is used, and lengths of the first information sequence are 8000, 6000, 4000, 2000, and 1000. Bit rates used during simulation include 1/5, 1/4, 1/3, 2/5, 1/2, 2/3, 3/4, 5/6, and 8/9. A modulation scheme is QPSK. An algorithm is a BP algorithm. It may be learned from FIG. 3a to FIG. 3a to FIG. 3c dial performance is all relatively desirable within the foregoing code lengths and bit rates.

Optionally, as described before, to further improve performance, a corrected lifting factor value may be used. A lifting factor value may be corrected in a plurality of manners. For example, an originally obtained lifting factor $z_{orig}$ may be corrected by using a lifting factor offset value, or values of z allowed to be used are stored. When $z_{orig}$ is not a value of z allowed to be used, a smallest value of the values of z allowed to be used that are greater than $z_{orig}$ is used as the corrected lifting factor.

In a possible implementation, $z_{orig}$ may be for example, the lifting factor value that is determined by the encoder based on the first information sequence, or may be the lifting factor value that is input by the another functional unit into the encoder. This is not limited in this embodiment of this application. In this embodiment of this application, the lifting factor value is corrected by using a lifting factor offset value, for example, $z=z_{orig}+\Delta z$, where $\Delta z$ is the lifting factor offset value.

A value of $\Delta z$ may be related to different factors, for example, related to at least one of the following factors: a formula that $a_{ij}$ meets, a system requirement, $z_{orig}$, or the like. A specific value of $\Delta z$ may be obtained through table lookup.

In an example, it is assumed that for $r_1(a_{ijEmax}, z)$, the form (b) is used, where $s_z=0$; for $r_2(z)$, the form (k) is used: and for $f(r_1(a_{ijEmax}, z), r_2(z))$, the form (m) is used. In this case, $a_{ij}$ meets:

$$a_{ij} = \begin{cases} a_{ijE\,max} & \text{if } a_{ijE\,max} < 1 \\ (a_{ijE\,max})\bmod 2' & \text{otherwise} \end{cases} \quad \text{Formula (3)}$$

Values of $\Delta z$ and t may be determined from Table 2. It may be understood that Table 2 is merely an example. A correspondence between $\Delta z$ and t and $z_{orig}$ may be different from that in the forms shown in Table 2. This is not limited in this embodiment of this application.

TABLE 2

| $z_{orig}$ | $\Delta z$ | $z = z_{orig} + \Delta z$ | t |
|---|---|---|---|
| 7 | 1 | 8 | 3 |
| 8 | 1 | 9 | 3 |
| 9 | 1 | 10 | 3 |
| 10 | 1 | 11 | 3 |
| 11 | 1 | 12 | 3 |
| 12 | 1 | 13 | 3 |
| 13 | 3 | 16 | 4 |
| 14 | 2 | 16 | 4 |
| 15 | 1 | 16 | 4 |
| 16 | 1 | 17 | 4 |
| 17 | 0 | 17 | 4 |
| 18 | 0 | 18 | 4 |

TABLE 2-continued

| $z_{orig}$ | $\Delta z$ | $z = z_{orig} + \Delta z$ | t |
|---|---|---|---|
| 19 | 2 | 21 | 4 |
| 20 | 2 | 22 | 4 |
| 21 | 2 | 23 | 4 |
| 22 | 1 | 23 | 4 |
| 23 | 1 | 24 | 4 |
| 24 | 2 | 26 | 4 |
| 25 | 2 | 27 | 4 |
| 26 | 1 | 27 | 4 |
| 27 | 0 | 27 | 4 |
| 28 | 0 | 28 | 4 |
| 29 | 3 | 32 | 5 |
| 30 | 2 | 32 | 5 |
| 31 | 1 | 32 | 5 |
| 32 | 2 | 34 | 5 |
| 33 | 1 | 34 | 5 |
| 34 | 3 | 37 | 5 |
| 35 | 3 | 38 | 5 |
| 36 | 1 | 37 | 5 |
| 37 | 2 | 39 | 5 |
| 38 | 3 | 41 | 5 |
| 39 | 3 | 42 | 5 |
| 40 | 3 | 43 | 5 |
| 41 | 2 | 43 | 5 |
| 42 | 2 | 44 | 5 |
| 43 | 3 | 46 | 5 |
| 44 | 3 | 47 | 5 |
| 45 | 3 | 48 | 5 |
| 46 | 3 | 49 | 5 |
| 47 | 2 | 49 | 5 |
| 48 | 3 | 51 | 5 |
| 49 | 3 | 52 | 5 |
| 50 | 1 | 51 | 5 |
| 51 | 1 | 52 | 5 |
| 52 | 3 | 55 | 5 |
| 53 | 2 | 55 | 5 |
| 54 | 1 | 55 | 5 |
| 55 | 3 | 58 | 5 |
| 56 | 2 | 58 | 5 |
| 57 | 3 | 60 | 5 |
| 58 | 2 | 60 | 5 |
| 59 | 3 | 62 | 5 |
| 60 | 3 | 63 | 5 |
| 61 | 3 | 64 | 6 |
| 62 | 2 | 64 | 6 |
| 63 | 1 | 64 | 6 |
| 64 | 0 | 64 | 6 |
| 65 | 1 | 66 | 6 |
| 66 | 3 | 69 | 6 |
| 67 | 2 | 69 | 6 |
| 68 | 1 | 69 | 6 |
| 69 | 0 | 69 | 6 |
| 70 | 1 | 71 | 6 |
| 71 | 0 | 71 | 6 |
| 72 | 1 | 73 | 6 |
| 73 | 1 | 74 | 6 |
| 74 | 0 | 74 | 6 |
| 75 | 1 | 76 | 6 |
| 76 | 1 | 77 | 6 |
| 77 | 3 | 80 | 6 |
| 78 | 2 | 80 | 6 |
| 79 | 0 | 79 | 6 |
| 80 | 2 | 82 | 6 |
| 81 | 1 | 82 | 6 |
| 82 | 1 | 83 | 6 |
| 83 | 0 | 83 | 6 |
| 84 | 1 | 85 | 6 |
| 85 | 1 | 86 | 6 |
| 86 | 2 | 88 | 6 |
| 87 | 0 | 87 | 6 |
| 88 | 3 | 91 | 6 |
| 89 | 2 | 91 | 6 |
| 90 | 1 | 91 | 6 |
| 91 | 0 | 91 | 6 |
| 92 | 3 | 95 | 6 |
| 93 | 3 | 96 | 6 |
| 94 | 1 | 95 | 6 |
| 95 | 2 | 97 | 6 |
| 96 | 0 | 96 | 6 |

TABLE 2-continued

| $z_{orig}$ | $\Delta z$ | $z = z_{orig} + \Delta z$ | t |
|---|---|---|---|
| 97 | 0 | 97 | 6 |
| 98 | 1 | 99 | 6 |
| 99 | 0 | 99 | 6 |
| 100 | 0 | 100 | 6 |
| 101 | 2 | 103 | 6 |
| 102 | 1 | 103 | 6 |
| 103 | 2 | 105 | 6 |
| 104 | 0 | 104 | 6 |
| 105 | 1 | 106 | 6 |
| 106 | 0 | 106 | 6 |
| 107 | 0 | 107 | 6 |
| 108 | 3 | 111 | 6 |
| 109 | 2 | 111 | 6 |
| 110 | 1 | 111 | 6 |
| 111 | 0 | 111 | 6 |
| 112 | 0 | 112 | 6 |
| 113 | 2 | 115 | 6 |
| 114 | 1 | 115 | 6 |
| 115 | 0 | 115 | 6 |
| 116 | 3 | 119 | 6 |
| 117 | 2 | 119 | 6 |
| 118 | 1 | 119 | 6 |
| 119 | 1 | 120 | 6 |
| 120 | 1 | 121 | 6 |
| 121 | 1 | 122 | 6 |
| 122 | 2 | 124 | 6 |
| 123 | 1 | 124 | 6 |
| 124 | 0 | 124 | 6 |
| 125 | 3 | 128 | 7 |
| 126 | 3 | 129 | 7 |
| 127 | 9 | 129 | 7 |
| 128 | 3 | 131 | 7 |
| 129 | 0 | 129 | 7 |
| 130 | 1 | 131 | 7 |
| 131 | 0 | 131 | 7 |
| 132 | 3 | 135 | 7 |
| 133 | 2 | 135 | 7 |
| 134 | 1 | 135 | 7 |
| 135 | 0 | 135 | 7 |
| 136 | 0 | 136 | 7 |
| 137 | 3 | 140 | 7 |
| 138 | 2 | 140 | 7 |
| 139 | 1 | 140 | 7 |
| 140 | 0 | 140 | 7 |
| 141 | 3 | 144 | 7 |
| 142 | 0 | 142 | 7 |
| 143 | 3 | 146 | 7 |
| 144 | 1 | 145 | 7 |
| 145 | 1 | 146 | 7 |
| 146 | 3 | 149 | 7 |
| 147 | 0 | 147 | 7 |
| 148 | 1 | 149 | 7 |
| 149 | 0 | 149 | 7 |
| 150 | 0 | 150 | 7 |
| 151 | 0 | 151 | 7 |
| 152 | 3 | 155 | 7 |
| 153 | 0 | 153 | 7 |
| 154 | 1 | 155 | 7 |
| 155 | 3 | 158 | 7 |
| 156 | 2 | 158 | 7 |
| 157 | 1 | 158 | 7 |
| 158 | 9 | 160 | 7 |
| 159 | 0 | 159 | 7 |
| 160 | 0 | 160 | 7 |
| 161 | 1 | 162 | 7 |
| 162 | 0 | 162 | 7 |
| 163 | 1 | 164 | 7 |
| 164 | 0 | 164 | 7 |
| 165 | 3 | 168 | 7 |
| 166 | 2 | 168 | 7 |
| 167 | 3 | 170 | 7 |
| 168 | 1 | 169 | 7 |
| 169 | 1 | 170 | 7 |
| 170 | 2 | 172 | 7 |
| 171 | 1 | 172 | 7 |
| 172 | 0 | 172 | 7 |
| ... | ... | ... | ... |
| 512 | | 512 | 8 |

Figure 4:
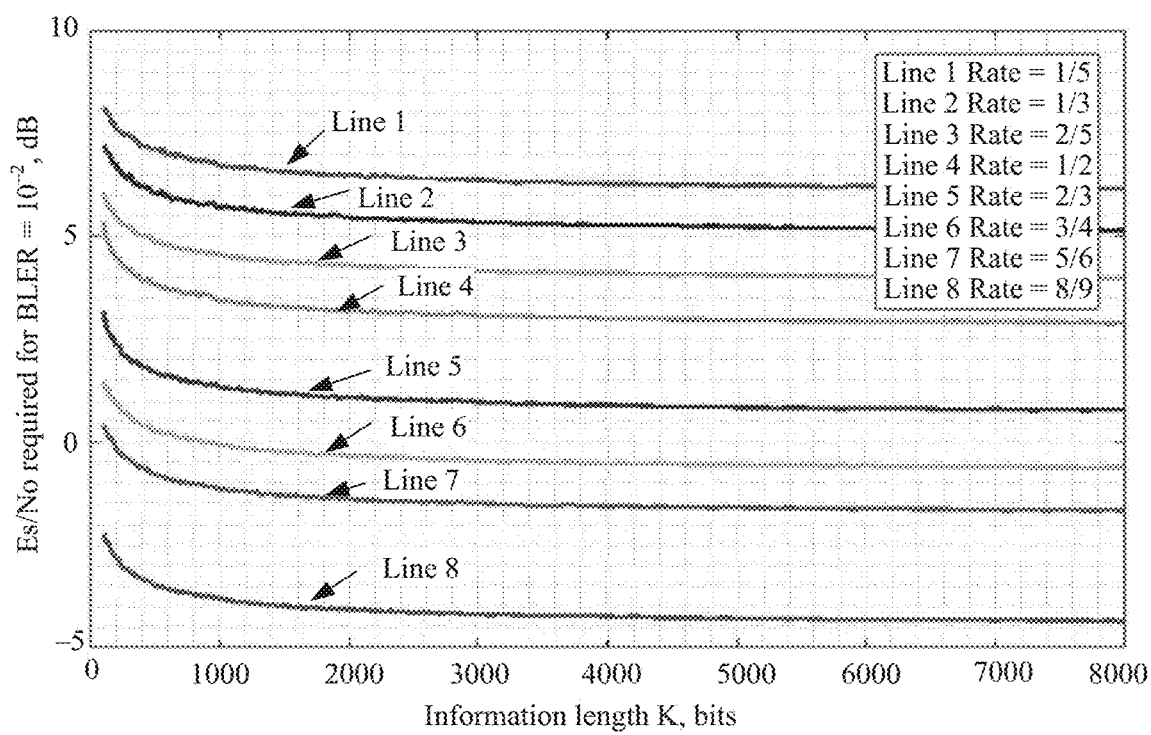
FIG. 4 is a performance simulation diagram of an encoding method according to an embodiment of this application.

Further, FIG. 4 shows block error rate simulation results when the formula (3) and Table 2 are used, a length of the first information sequence ranges from 96 to 8000, and bit rates are 8/9, 5/6, 3/4, 2/3, 1/2, 2/5, 1/3, 1/4, and 1/5. A modulation scheme used during simulation is QPSK. A simulation algorithm is a BP algorithm. A quantity of iteration times is 50. It may be learned from FIG. 4 that performance is further optimized through correction of a lifting factor In FIG. 2 to FIG. 4. Es/No is a signal-to-noise ratio in dB, Rate or CR is a bit rate, and information length K is an information sequence length.

In another possible implementation, it is assumed that $a_{ij}$ meets the formula (1). The value of $\Delta z$ may be determined from Table 3. It may be understood that Table 3 is merely an example. A correspondence between $z_{orig}$ and $\Delta z$ may be different from that in the forms in Table 3. This is not limited in this embodiment of this application. For example, $\Delta z$ may be stored as a non-zero $z_{orig}$, or $\Delta z$ may be stored as a zero $z_{orig}$.

TABLE 3

| $z_{orig}$ | $\Delta z$ |
|---|---|
| 7 | 0 |
| 8 | 0 |
| 9 | 0 |
| 10 | 1 |
| 11 | 0 |
| 12 | 0 |
| 13 | 1 |
| 14 | 0 |
| 15 | 0 |
| 16 | 0 |
| 17 | 1 |
| 18 | 1 |
| 19 | 0 |
| 20 | 0 |
| 21 | 1 |
| 22 | 1 |
| 23 | 0 |
| 24 | 0 |
| 25 | 1 |
| 26 | 1 |
| ... | 0 |
| 37 | 1 |
| 38 | 1 |
| 39 | 1 |
| 40 | 0 |
| 41 | 1 |
| ... | 0 |
| 50 | 1 |
| 51 | 0 |
| 52 | 1 |
| ... | 0 |
| 68 | 1 |
| ... | 0 |
| 78 | 1 |
| ... | 0 |
| 128 | 1 |
| ... | 0 |
| 168 | 1 |
| ... | 0 |
| 212 | 1 |

In this embodiment of this application, z is marked by correcting z, so that some particular values of z are not used, and a lower BLER is produced.

In a possible implementation, the encoding method in this embodiment of this application is applicable to a check matrix of a QC-LDPC code.

It may be understood that the first matrix in the embodiments of the encoding method may also be applicable to a decoding method. That is, in a decoding process, a matrix same as that in the encoding process is used for decoding. In a possible implementation, an obtaining manner of the first matrix may also be the same as that in the foregoing embodiments. In an example, the first matrix is used to decode a third information sequence to obtain a fourth information sequence. In a possible implementation, the third information sequence may correspond to the second information sequence, and the fourth information sequence may correspond to the first information sequence.

In a possible implementation, the decoding method may be applied to a corresponding communication method. The communication method is implemented by a corresponding communications device.

Figure 5:
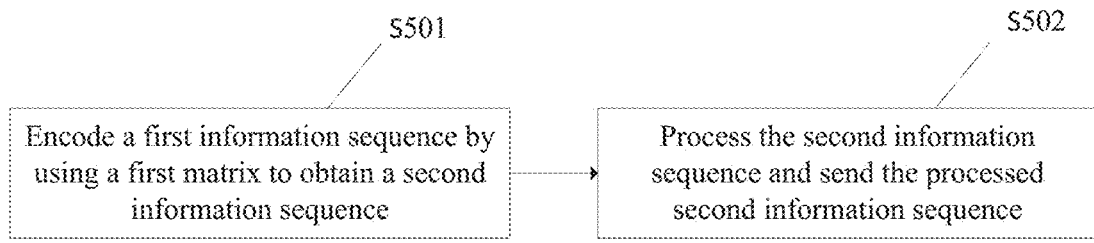
FIG. 5 is a schematic flow chart of a communication method according loan embodiment of this application.

An embodiment of this application further provides a communication method. The communication method applies various encoding methods described in the foregoing embodiments. As shown in FIG. 5, the communication method may include the following steps.

S501: Encode a first information sequence by using a first matrix to obtain a second information sequence.

For a method for encoding the first information sequence, refer to the related descriptions of the foregoing embodiments. Details are not described herein.

Optionally, before S501, some processing may be further included. To be specific, the first information sequence may be input into an encoder after being processed by another functional unit. In this embodiment of this application, a source and content of the first information sequence are not limited.

S502: Process the second information sequence and send the processed second information sequence.

Figure 6:
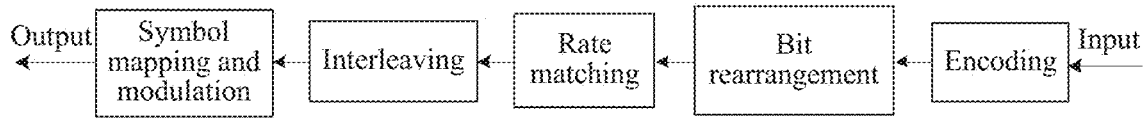
FIG. 6 is a schematic diagram of an encoding and processing process according to an embodiment of this application.

In a possible implementation, processing such as bit rearrangement, rate matching, interleaving, and symbol mapping and modulation may be performed on the second information sequence and then the processed second information sequence may be sent. FIG. 6 schematically shows a process of encoding the first information sequence and performing a series of processing on the first information sequence. It may be understood that for different systems or application scenarios, processing processes of the second information sequence may be different. For example, bit rearrangement may be used as optional processing. Examples of various processing processes are not enumerated for description in this embodiment of this application.

In this embodiment of this application, various encoding methods described in the foregoing embodiments are applied in the communication method, so that data transmission performance can be improved.

Figure 7:
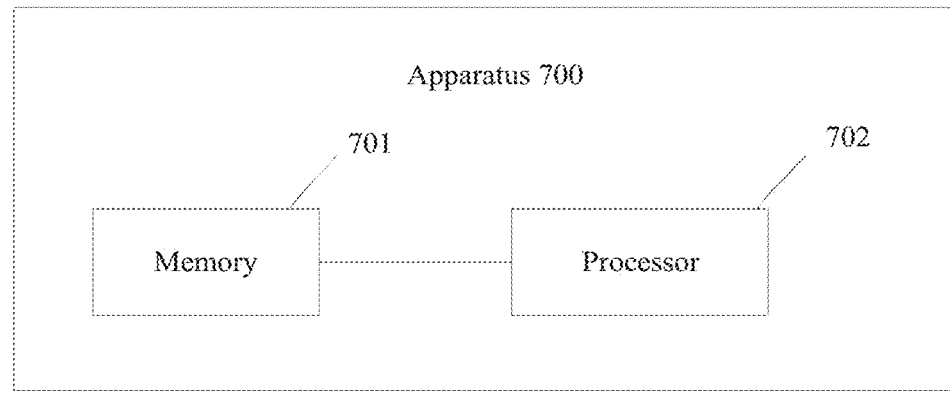
FIG. 7 is schematic structural diagram of an apparatus according to an embodiment of this application.

An embodiment of this application provides an apparatus 700. As shown in FIG. 7, the apparatus 700 includes: a memory 701, configured to store a first information sequence, and a processor 702, configured to encode the first information sequence by using a first matrix to obtain a second information sequence. Specifically, for a method for encoding the first information sequence by the processor 702, refer to the related descriptions of the foregoing embodiments. Details are not described herein.

In a possible implementation, the processor 702 is further configured to determine z based on $z=z_{orig}+\Delta z$, $z_{orig}$ is an originally obtained lifting factor value. $z_{orig}$ may be obtained by the processor 702 based on a length of the first information sequence. Alternatively, in a possible implementation, a value of $z_{orig}$ may be determined by another functional unit and then input to the apparatus 700.

An embodiment of this application further provides an apparatus. The apparatus includes at least one processor and a memory coupled to the at least one processor. The at least one processor is configured to execute an instruction m the memory, to encode a first information sequence by using a first matrix to obtain a second information sequence. For a method for encoding the first information sequence by the processor, refer to the related descriptions of the foregoing embodiments. Details are not described herein.

In a possible implementation, the apparatus in the foregoing embodiments may be an encoder. The second information sequence is used as an output of the encoder.

Figure 8:
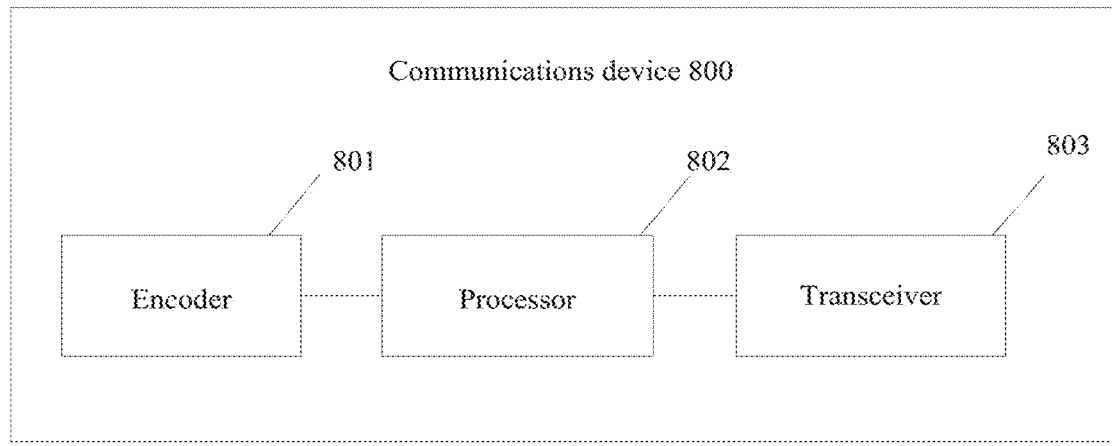
FIG. 8 is a schematic structural diagram of a communications device according to an embodiment of the present invention.

An embodiment of this application further provides a communications device 800. As shown in FIG. 8, the communications device 800 may include:

an encoder 801, configured to encode a first information sequence by using a first matrix to obtain a second information sequence;

at least one processor 802, configured to process the second information sequence; and a transceiver 803, configured to send the processed second information sequence.

Specifically, for a method for encoding the first information sequence by the encoder 801, refer to the related descriptions of the foregoing embodiments. For a structure and an implementation of the encoder, refer to the foregoing embodiments. Details are not described herein.

In a possible implementation, the at least one processor 802 may implement a series of processing such as bit rearrangement, rate matching, interleaving, and symbol mapping and modulation. It may be understood that for different systems or application scenarios, processing processes implemented by the processor 802 and composition structures of the processor 802 may be different. Examples are not enumerated for description in this embodiment of this application.

In a possible design, the communications device 800 may be a terminal device or a network device.

All or some of die foregoing embodiments may be implemented by using software, hardware, firmware, or any combination thereof. When the software is used to implement the embodiments, the embodiments may be implemented completely or partially in a form of a computer program product. The computer program product includes one or more computer instructions. When the computer program instructions are loaded and executed on a computer, the procedure or functions according to the embodiments of the present invention are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a Solid State Disk (SSD)), or the like.

A person skilled in the art may clearly understand that, the technologies in the embodiments of this application may be implemented by software in addition to a necessary general hardware platform. Based on such an understanding, the technical solutions in the embodiments of this application essentially or the part contributing to the prior art may be implemented in a form of a software product. The software product may be stored in a storage medium such as a ROM/RAM, a magnetic disc, or a compact disc, and includes several instructions for instructing a computer device (which may be a personal computer, a server, or a network device) to perform the methods described in the embodiments or some parts of the embodiments of this application.

Same and similar parts between embodiments in the specification may refer to each other.

The foregoing implementations of this application are not intended to limit the protection scope of this application

What is claimed is:

1. A communication method applied in a first communication device of encoding end, comprising:

encoding a first information sequence by using a first matrix to obtain a second information sequence, wherein the first matrix is a matrix whose size is $m_b z \times n_b z$, z is a factor, the first matrix comprises $m_b \times n_b$ submatrices whose sizes are $Z \times Z$, the $m_b \times n_b$ submatrices whose sizes are $Z \times Z$ comprise at least one cyclic shift matrix whose size is $Z \times Z$ and that is based on an identity matrix, and a cyclic shift value of each cyclic shift matrix is an element that is in a matrix E(H) and that is at a location corresponding to the cyclic shift matrix, and wherein the matrix E(H) is $$\begin{bmatrix} a_{11} & a_{12} & \ldots & a_{1n_b} \\ a_{21} & a_{22} & \ldots & a_{2n_b} \\ \vdots & \vdots & \ddots & \vdots \\ a_{m_b 1} & a_{m_b 2} & \ldots & a_{m_b n_b} \end{bmatrix},$$

an element $a_{ij}$ in E(H) meets $$a_{ij} = \begin{cases} a_{ijEmax} & \text{if } a_{ijEmax} < 1 \\ f(r_1(a_{ijEmax}, z), r_2(z)) & \text{otherwise} \end{cases},$$

and $a_{ijEmax}$ is an element in a cyclic shift value matrix $E_{max}(H)$ corresponding to a maximum lifting factor $z_{max}$, $r_1(a_{ijEmax}, z)$ represents a function whose parameters are $a_{ijEmax}$ and z, $r_2(z)$ represents a function whose parameter is z, $f(r_1(a_{ijEmax}, z) r_2(z))$ represents a function whose parameters are $r_1(a_{ijEmax}, z)$ and $r_2(z)$ a value of $f(r_1(a_{ijEmax}, z), r_2(z))$ is less than z, wherein a value of $r_1(a_{ijEmax}, z)$ is determined based on a sum of an offset value corresponding to z and $a_{ijEmax}$;

outputting the second information sequence, wherein $r_1(a_{ijEmax}, z)$ comprises one of the following:

$r_1(a_{tEmax}, z) = a_{ijEmax} + \text{Int}(a_{ijEmax}/C) \cdot s_z;$ $r_1(a_{ijEmax}, z) = a_{ijEmax} + \text{Int}(e/a_{ijEmax}) \cdot s_z;$ $r_1(a_{ijEmax}, z) = a_{ijEmax} + \text{Int}(s_z/a_{ijEmax});$ $r_1(a_{ijEmax}, z) = a_{ijEmax} + \text{Int}(a_{ijEmax}/z);$ $r_1(a_{ijEmax}, z) = a_{ijEmax} + (z_{max} - a_{ijEmax}) s_z;$ and $r_1(a_{ijEmax}, z = a_{ijEmax} + \text{Int}((s_z \cdot a_{ijEmax})/c),$ and $r_2(z)$ comprises one of the following:

$r_2(z) = z;$ $r_2(z) = 2^{floor(log\ 2(z))};$ and $r_2(z) = N_z$, c is a preset constant, $s_z$ is a nonnegative integer corresponding to z, and Int( ) is a rounding function $N_z$ is a positive integer less than Z, and floor is a rounding down function, $f(r_1(a_{ijEmax}, z), r_2(z) = r_1(a_{ijEmax}, z) \mod r_2(z);$ and processing the second information sequence and sending the processed second information sequence to a second communication device of decoding end, wherein the processing comprises at least one of bit rearrangement, rate matching, interleaving, or symbol mapping and modulation.

2. The method according to claim 1, wherein $z = z_{orig} + \Delta_z$, wherein:

$\Delta_z$ is a lifting factor offset value, and $z_{orig}$ is an originally obtained lifting factor value.

3. The method according to claim 1, wherein the lifting factor z is provided as an input or wherein the lifting factor z is calculated based on a length of the first information sequence, and wherein when the lifting factor z is not one of a set of stored values of the lifting factor z that are allowed to be used, the lifting factor z is corrected to be the smallest value among the set of stored values of lifting factor z that are greater than the lifting factor z.

4. A communication apparatus of encoding end, comprising:

a memory, the memory configured to store a first information sequence; and at least one processor, the at least one processor configured to encode the first information sequence by using a first matrix to obtain a second information sequence, wherein the first matrix is a matrix whose size is $m_b z \times n_b z$, z is a lifting factor, the first matrix comprises $m_b \times n_b$ submatrices whose sizes are $Z \times Z$, the $m_b \times n_b$ submatrices whose sizes are $Z \times Z$ comprise at least one cyclic shift matrix whose size is $z \times z$ and that is based on an identity matrix, and a cyclic shift value of each cyclic shift matrix is an element that is in a matrix E(H) and that is at a location corresponding to the cyclic shift matrix, and wherein the matrix E(H) is $$\begin{bmatrix} a_{11} & a_{12} & \ldots & a_{1n_b} \\ a_{21} & a_{22} & \ldots & a_{2n_b} \\ \vdots & \vdots & \ddots & \vdots \\ a_{m_b 1} & a_{m_b 2} & \ldots & a_{m_b n_b} \end{bmatrix},$$

in an element $a_{ij}$ in E(H) meets $$a_{ij} = \begin{cases} a_{ijEmax} & \text{if } a_{ijEmax} < 1 \\ f(r_1(a_{ijEmax}, z), r_2(z)) & \text{otherwise} \end{cases},$$

and a$_{ijEmax}$ is an element in a cyclic shift value matrix E$_{max}$(H) corresponding to a maximum lifting factor z$_{max}$, r$_1$(a$_{ijEmax}$, z) represents a function whose parameters are a$_{ijEmax}$ and z, r$_2$(z) represents a function whose parameter is z, $f$(r$_1$(a$_{ijEmax}$,z) r$_2$(z)) represents a function whose parameters are r$_1$(a$_{ijEmax}$, z) and r$_2$(z), and a value of $f$(r$_1$(a$_{ijEmax}$,z), r$_2$(z)) is less than z, wherein a value of r$_1$(a$_{ijEmax}$, z) is determined based on a sum of an offset value corresponding to z and a$_{ijEmax}$;

output the second information sequence, wherein r$_1$(a$_{ijEmax}$,z) comprises one of the following:

$r_1(a_{ijEmax},z) = a_{ijEmax} + \text{Int}(a_{ijEmax}/c) \cdot s_z;$ $r_1(a_{ijEmax},z) = a_{ijEmax} + \text{Int}(c/a_{ijEmax}) \cdot s_z;$ $r_1(a_{ijEmax},z) = a_{ijEmax} + \text{Int}(s_z/a_{tiEmax});$ $r_1(a_{ijEmax},z) = a_{ijEmax} + \text{Int}(a_{ijEmax}/z);$ $r_1(a_{ijEmax},z) = a_{ijEmax} + (z_{max} - a_{ijEmax}) \cdot s_z;$ and $r_1(a_{ijEmax},z) = a_{ijEmax} + \text{Int}((s_z \cdot a_{ijEmax})/c),$ and r$_2$(z) comprises one of the following:

$r_2(z) = z$ $r_2(z) = 2^{floor(log\ 2(z))};$ and r$_2$(z)=N$_z$, c is a preset constant, s$_z$ is a nonnegative integer corresponding to z, and Int( ) is a rounding function N$_z$ is a positive integer less than z, and floor is a rounding-down function $f$(r$_1$(a$_{ijEmax}$,z), r$_2$(z))=r$_1$(a$_{ijEmax}$,z) mod r$_2$(z); and process the second information sequence and send the processed second information sequence to a communication device of decoding end, wherein the processing comprises at least one of bit rearrangement, rate matching, interleaving, or symbol mapping and modulation.

5. The apparatus according to claim 4, wherein the at least one processor is configured to determine z based on z=z$_{orig}$+Δ$_z$, wherein Δ$_z$ is a lifting factor offset value, and z$_{orig}$ is an originally obtained lifting factor value.

6. The apparatus according to claim 4, wherein the lifting factor z is provided as an input or wherein the lifting factor z is calculated based on a length of the first information sequence, and wherein when the lifting factor z is not one of a set of stored values of the lifting factor z that are allowed to be used, the lifting factor z is corrected to be the smallest value among the set of stored values of lifting factor z that are greater than the lifting factor z.

7. A non-transitory computer-readable storage medium, the medium comprising instructions which, when executed by one or more processors, cause the one or more processors to perform operations comprising:

encoding a first information sequence by using a first matrix to obtain a second information sequence, wherein the first matrix is a matrix whose size is m$_b$z×n$_b$z z is a lifting factor, the first matrix comprises m$_b$×n$_b$ submatrices whose sizes are z×z, the m$_b$×n$_b$ submatrices whose sizes are z×z comprise at least one cyclic shift matrix whose size is z×z and that is based on an identity matrix, and a cyclic shift value of each cyclic shift matrix is an element that is in a matrix E(H) and that is at a location corresponding to the cyclic shift matrix, and wherein the matrix $$\begin{bmatrix} a_{11} & a_{12} & \cdots & a_{1n_b} \\ a_{21} & a_{22} & \cdots & a_{2n_b} \\ \vdots & \vdots & \ddots & \vdots \\ a_{m_b 1} & a_{m_b 2} & \cdots & a_{m_b n_b} \end{bmatrix},$$

an element a$_{ij}$ in E(H) meets $$a_{ij} = \begin{cases} a_{ijE\,max} & \text{if } a_{ijE\,max} < 1 \\ f(r_1(a_{ijE\,max}, z), r_2(z)) & \text{otherwise} \end{cases},$$

and a$_{ijEmax}$ is an element in a cyclic shift value matrix E$_{max}$(H) corresponding to a maximum lifting factor z$_{max}$, r$_1$(a$_{ijEmax}$,z) represents a function whose parameters are a$_{ijEmax}$ and z, r$_2$(z) represents a function whose parameter is z, $f$(r$_1$(a$_{ijEmax}$,z), r$_2$(z)) represents a function whose parameters are r$_1$(a$_{ijEmax}$,z) and r$_2$(z), and a value of $f$(r$_1$(a$_{ijEmax}$,z), r$_2$(z)) is less than z, wherein a value of r$_1$(a$_{ijEmax}$, z) is determined based on a sum of an offset value corresponding to z and a$_{ijEmax}$;

outputting the second information sequence, wherein r$_1$(a$_{ijEmax}$,z) comprises one of the following:

$r_1(a_{ijEmax},z) = a_{ijEmax} + \text{Int}(a_{ijEmax}/c) \cdot s_z;$ $r_1(a_{ijEmax},z) = a_{ijEmax} + \text{Int}(c/a_{ijEmax}) \cdot s_z;$ $r_1(a_{ijEmax},z) = a_{ijEmax} + \text{Int}(s_z/a_{ijEmax});$ $r_1(a_{ijEmax},z) = a_{ijEmax} + \text{Int}(a_{ijEmax}/z);$ $r_1(a_{ijEmax},z) = a_{ijEmax} + (z_{max} - a_{ijEmax}) \cdot s_z;$ and $r_1(a_{ijEmax},z) = a_{ijEmax} + \text{Int}((s_z \cdot a_{ijEmax})/c),$ and r$_2$(z) comprises one of the following:

$r_2(z) = z$ $r_2(z) = 2^{floor(log\ 2(z))};$ and r$_2$(z)=N$_z$, c is a preset constant s$_z$ is a nonnegative integer corresponding to z, and Int( ) is a rounding function, N$_z$ is a positive integer less than z, and floor is a rounding function, $f(r_1(a_{ijEmax},z),r_2(z)) = r_1(a_{ijEmax},z) \bmod r_2(z);$ and processing the second information sequence and sending the processed second information sequence to a communication device of decoding end, wherein the processing comprises at least one of bit rearrangement, rate matching, interleaving, or symbol mapping and modulation.

8. The medium according to claim 7, wherein a value of r$_1$(a$_{ijEmax}$, z) is determined based on a sum of an offset value corresponding to z and a$_{ijEmax}$, wherein z=z$_{orig}$+Δz, and wherein:

Δz is a lifting factor offset value, and z$_{orig}$ is an originally obtained lifting factor value.

9. The medium according to claim 7, wherein the lifting factor z is provided as an input or wherein the lifting factor z is calculated based on a length of the first information sequence, and wherein when the lifting factor z is not one of a set of stored values of the lifting factor z that are allowed to be used, the lifting factor z is corrected to be the smallest value among the set of stored values of lifting factor z that are greater than the lifting factor z.

* * * * *